United States Patent [19]
Wall

[11] Patent Number: 5,045,685
[45] Date of Patent: Sep. 3, 1991

[54] ANALOG TO DIGITAL CONVERSION ON MULTIPLE CHANNEL IC CHIPS

[75] Inventor: Llewellyn E. Wall, Concord, Mass.

[73] Assignee: Irvine Sensors Corporation, Costa Mesa, Calif.

[21] Appl. No.: 534,969

[22] Filed: Jun. 6, 1990

Related U.S. Application Data

[63] Continuation-in-part of Ser. No. 329,003, Mar. 27, 1989, abandoned.

[51] Int. Cl.[5] .............................................. H01J 40/14
[52] U.S. Cl. ................................ 250/208.1; 250/211 J
[58] Field of Search ............... 250/208.1, 208.2, 211 J, 250/211 R, 214 R, 209; 357/30 H

[56] References Cited
U.S. PATENT DOCUMENTS
4,704,319 11/1987 Belanger et al. ................. 250/211 J

*Primary Examiner*—David C. Nelms
*Attorney, Agent, or Firm*—Thomas J. Plante

[57] ABSTRACT

An integrated circuit chip having a plurality of parallel channels, and a stack of such chips, are disclosed, in which the function of A/D signal conversion is accomplished in each on-chip channel. In order to satisfy the power and real estate limitations of the chip(s), a substantial part of the A/D conversion circuitry is located off-chip. Two devices are required in each channel on each chip, a precision comparator, and a storage register. These may be combined with an off-chip analog ramp, and an off-chip digital ramp. Certain on-chip performance enhancements are disclosed, which can operate either in the analog mode or the digital mode. One such enhancement is compensating for the voltage offset of each comparator. Another enhancement is reducing the duty cycle of each precision comparator, in order to lower power requirements. An important use for the disclosed concepts is the field of multi-layer Z-technology modules, having two dimensional photo-detector arrays.

35 Claims, 7 Drawing Sheets

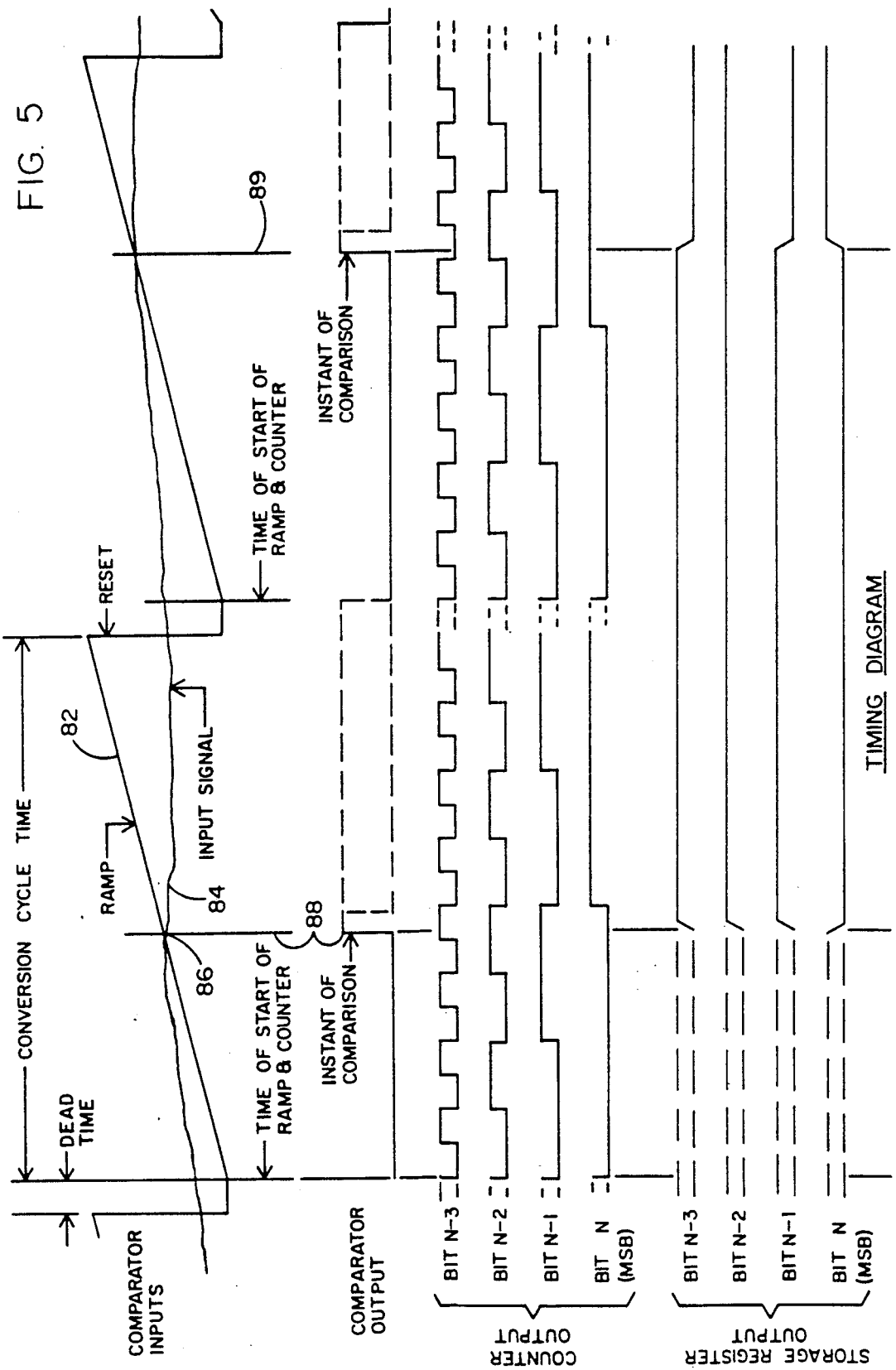

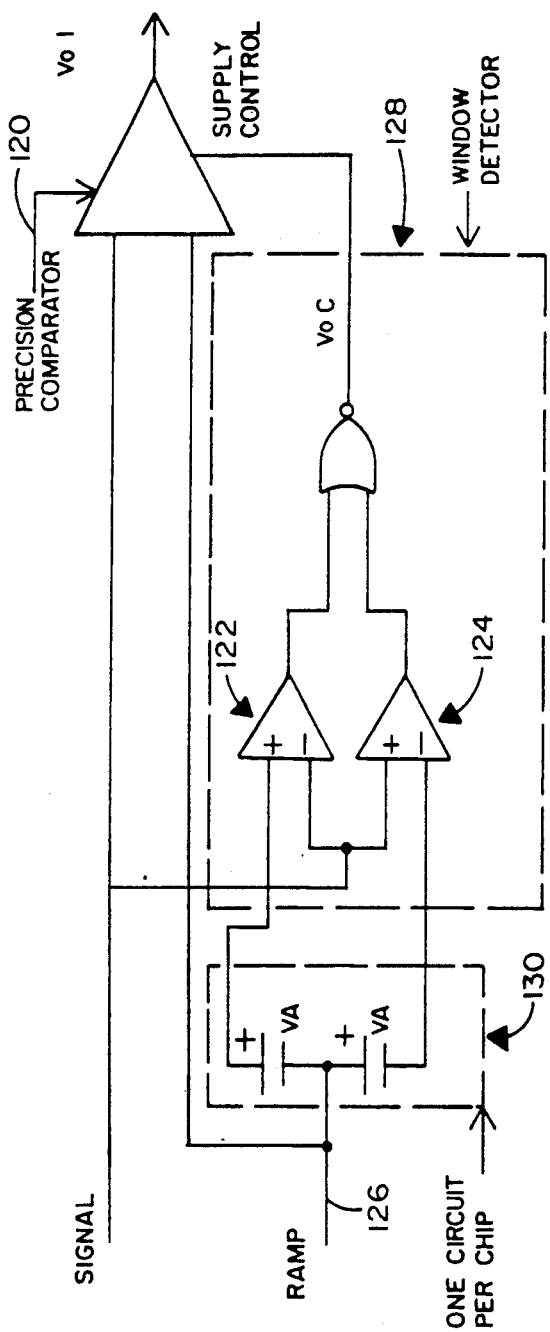
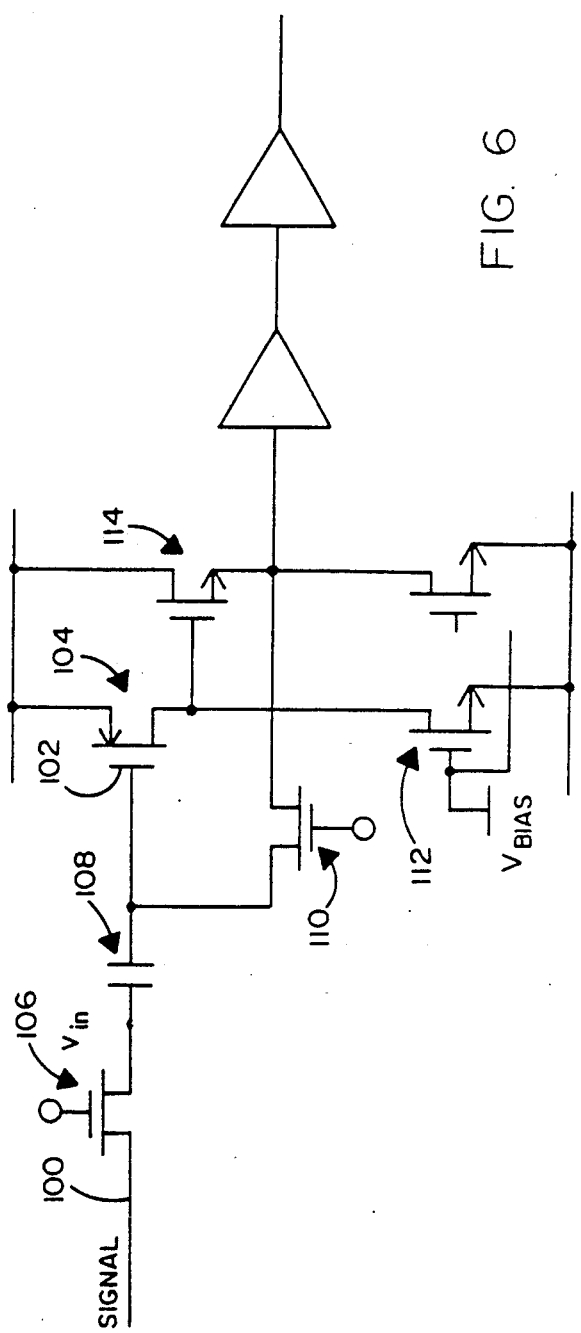
FIG. 7
FIG. 6

5,045,685

ANALOG TO DIGITAL CONVERSION ON MULTIPLE CHANNEL IC CHIPS

This application is a continuation-in-part of application Ser. No. 329,003, filed Mar. 27, 1989.

BACKGROUND OF THE INVENTION

This invention relates to densely packaged electronic signal processing circuits which provide maximum signal manipulation closely adjacent to multiple analog signal generators.

In certain situations it is very desirable to complete several signal manipulations in each of a plurality of parallel channels on a single chip, which is immediately adjacent to a plurality of analog signal transducers. An important advantage can be provided by accomplishing analog to digital conversion in each on-chip channel.

The field of current primary interest is photodetector arrays, whose output efficiency is enhanced by minimizing the signal processing which is located remote from the photodetector arrays, and maximizing the signal processing which occurs "at the focal plane". Usually, but not always, the distinction between "on focal plane" (close proximity) and "off focal plane" (remote) signal processing is determined by the fact that the former is located in an artificially cooled environment (e.g., inside a Dewar), whereas the latter is not in an artificially cooled environment.

However, other types of transducer arrays, e.g., audio, temperature, and pressure, may benefit from the concepts of the present invention. In general, the arrays and their parallel electronic channels are characterized by limited available real estate, and by the need to maintain low power operation. Noise corruption of the signals may be a problem if the conversion to digital signals is remote from the analog transducers.

Developments leading to the problem-solving which motivated the present invention were primarily in the field of "Z-technology", a field pioneered by the assignee of the present invention. (See U.S. Pat. Nos. 4,490,626; 4,551,629; 4,555,623; and 4,672,737.)

In Z-technology, photodetectors are spaced along the focal plane in both X and Y dimensions, and electronic circuitry is buried in a stack of IC chips extending in the Z dimension. In the prior patents referred to, Z-technology modules are disclosed in which the photodetector signals are pre-amplified, filtered, and multiplexed in a cooled environment, before the signals are transmitted to more remote electronic equipment. The pre-multiplexing and multiplexing functions are performed within the Z dimension, in order to improve electronic performance and simplify electrical connections between the focal plane modules and the non-focal plane circuitry.

STATEMENT OF THE INVENTION

In order to increase the efficiency of the electronics of the transducer-adjacent electronic circuitry on IC chip(s), the present invention provides analog to digital signal conversion on such chip(s), and multiplexes the digital information to the more remote circuitry.

Because of the limited real estate available for such circuitry, the present invention locates part of the A to D conversion circuitry elsewhere, so that essentially each analog signal channel on each chip requires only a comparator and a storage register for on-chip A/D conversion. Other functions, which are common to many channels (each channel is, for example, a separate photodetector circuit) can be located outside the chip(s), thus conserving real estate.

Certain on-chip enhancements may be provided, primarily for two purposes: (1) improving accuracy of output signals by providing voltage offset corrections; and (2) reducing on-chip power requirements by limiting the duty cycle of the precision comparator in each photodetector channel.

BRIEF DESCRIPTION OF THE DRAWINGS

The following description refers to the use of the present invention in conjunction with a Z-technology module. However, as stated above, the inventive concepts are also relevant to the broader fields discussed above.

FIG. 5 is a timing diagram, which shows the operation of the A/D conversion of FIG. 4 as a function of time;

FIG. 6 shows schematically an on-chip circuit (channel) which operates in the analog mode to compensate for offset voltage of the associated precision comparator;

FIG. 7 shows schematically an on-chip circuit (channel) which operates in the analog mode to reduce the duty cycle (and power consumption) of the associated precision comparator;

DETAILED DESCRIPTION OF SPECIFIC EMBODIMENTS

The general concepts of focal plane circuitry and Z-technology modules are fully explained in the patents listed under Background of the Invention. As stated above, this technology provides an example of the potential uses of the present invention.

Figure 1:
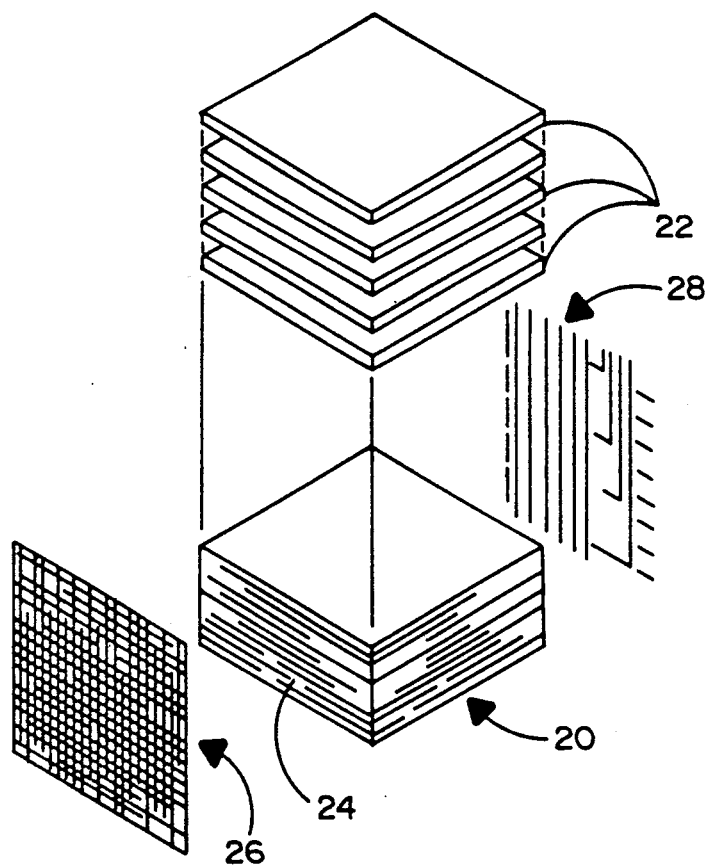
FIG. 1 is identical (except for numerals) to FIG. 2 of common assignee U.S. Pat. No. 4,617,160; it shows a stacked-chip module which provides Z-technology benefits.

FIG. 1 (taken from U.S. Pat. No. 4,617,160) is an exploded view showing a module 20 comprising a stack of separately formed IC chips 22. After the chips have been stacked and secured together, photodetectors constituting a two-dimensional array are provided on the front, or focal, plane 24 of the module; and, on the rear, or access, plane of the module, back plane wiring 28 is provided. Each module may be one of many abutting modules. In each module the stacked chips, each of which may have an area of 500 mils × 500 mils, or less, extend in planes perpendicular to the focal plane. The photodetectors are supported on the focal plane of the module, each in electrical contact with a separate lead on one of the chips.

Each chip has circuitry which provides a number of parallel channels, each of which amplifies and further processes the signals from a separate photodetector. The center-to-center spacing of photodetectors along the X-axis and Y-axis of the focal plane 24 may be as small as 0.002 to 0.004 inch.

Figure 2:
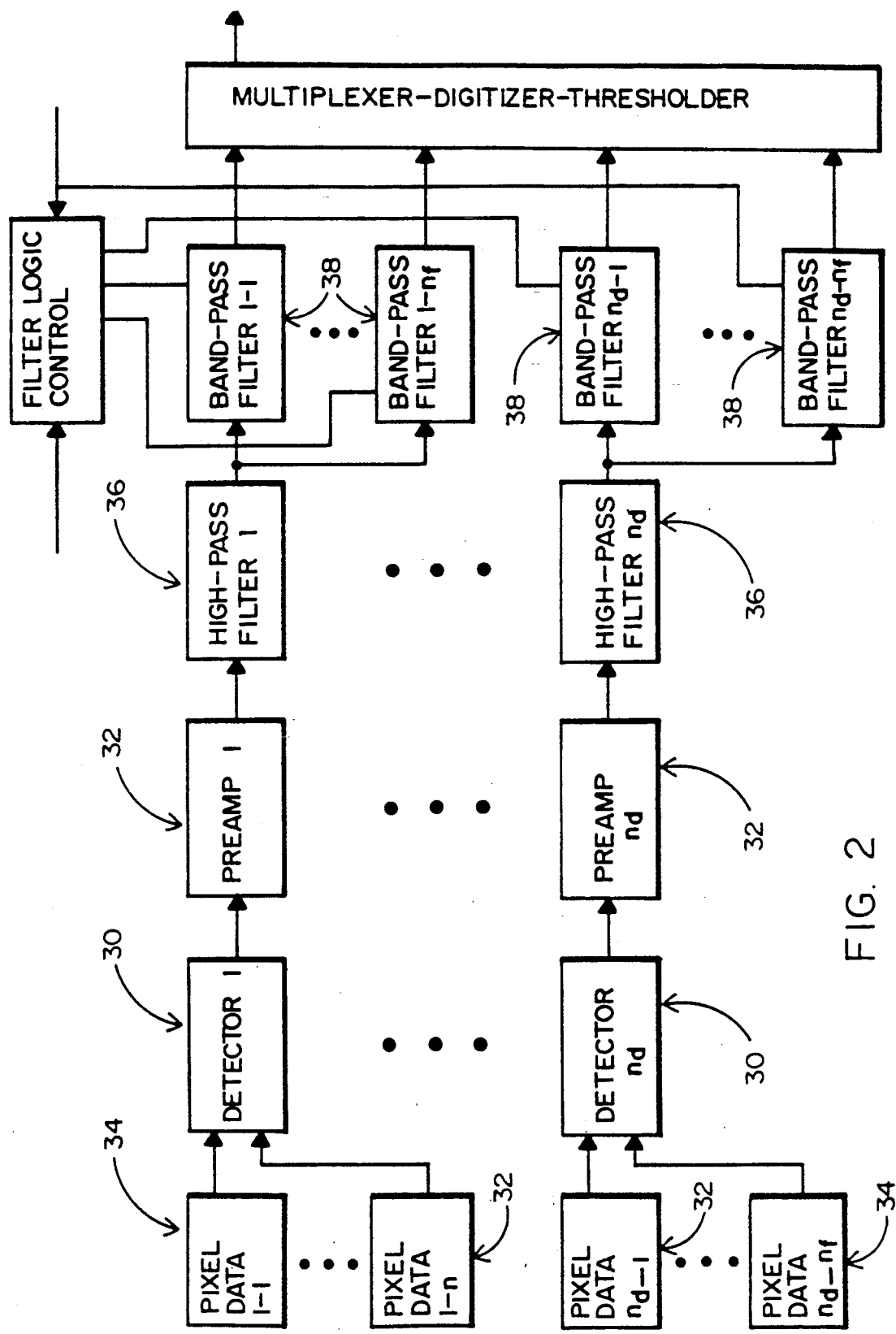
FIG. 2 is identical (except for numerals) to FIG. 2 of common assignee U.S. Pat. No. 4,675,532; it shows sophisticated, multi-channel on-chip circuitry.

FIG. 2 (taken from U.S. Pat. No. 4,675,532) shows the on-chip circuitry of a chip used in a combined staring/scanning system. Two detectors are shown, each indicated by the numeral 30. One is designated "Detector 1", and the other is designated "Detector n(d)", indicating that any desired number (n) of detectors can be connected in parallel in the circuitry. The output of each detector is input to its own preamp 32.

Each detector 30 has a plurality of inputs, or signal sources, 34, two of which are shown. One is designated "Pixel data 1--1" and the other is designated "Pixel data 1--n", indicating that a plurality (n) of such signal sources are providing inputs to a single detector. (The value of "n" for the number of detectors is not related to the value of "n" for the number of separate inputs to each detector).

Each preamp 32 directs its output to a series filter 36, the number of which filters equals the number of detectors. Each filter 36 acts as a "spatial" filter, which passes relatively high frequency signals.

From each spatial filter 36, a plurality of parallel output leads provide inputs to a plurality of parallel bandpass filters 38. Each filter 38 acts as a "temporal" filter, which passes signals having much lower frequencies than those passed by the spatial filter 36. One spatial filter 36 is shown connected to two parallel temporal filters 38, which are designated "Band-pass filter 1--1" and "Band-pass filter 1--n(f)", respectively. Another spatial filter 36 is also shown connected to two parallel temporal filters 38 which are designated "Band pass filter n(d)--1" and "Band-pass filter n(d)", respectively.

The multi-channel on-chip circuitry just described is part of a very sophisticated and complex system. The present invention may be used in similar complex systems, or may be used in any other system having multi-channel on-chip analog signals.

Figure 3:
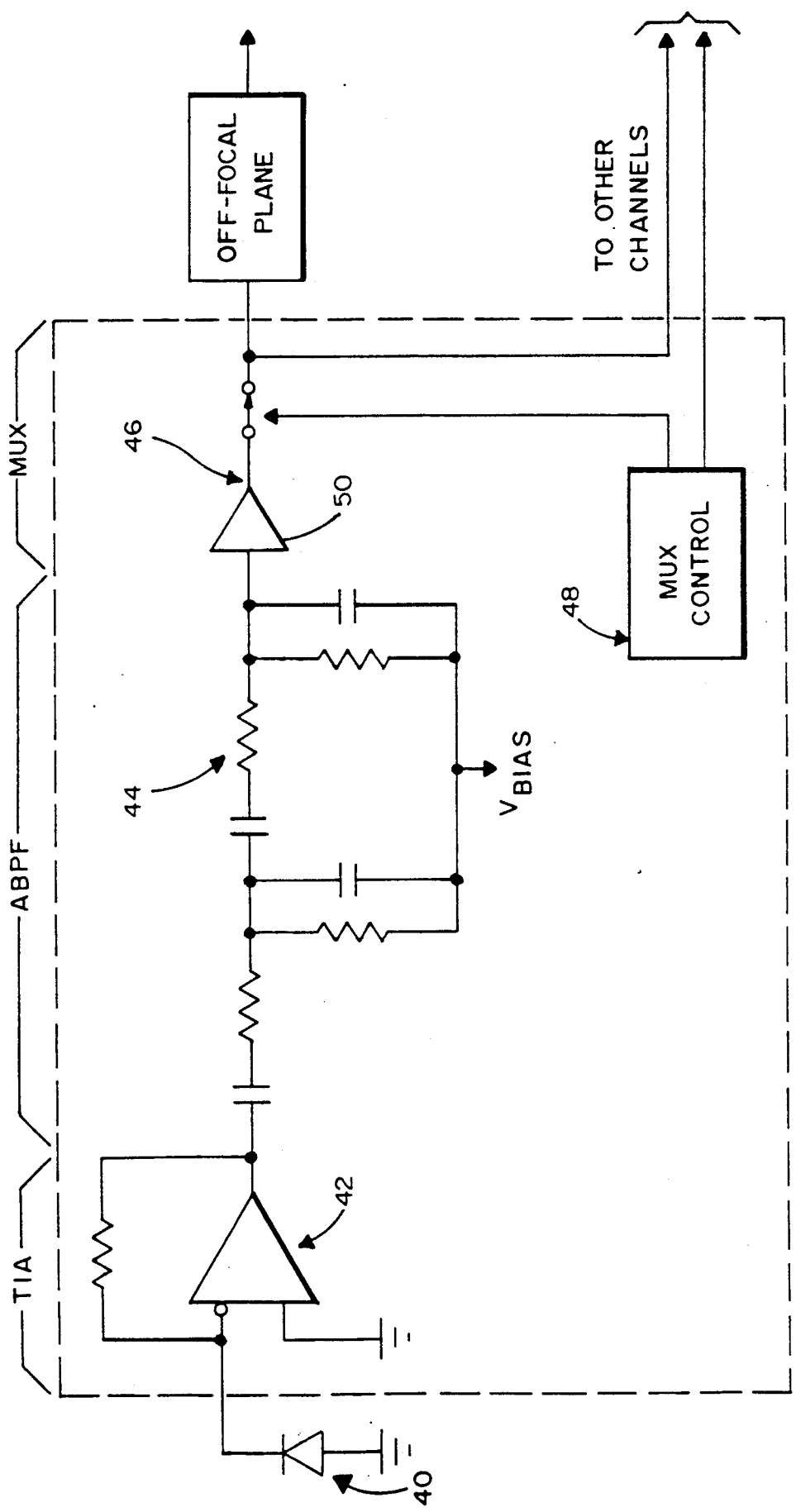
FIG. 3 is identical (except for numerals) to FIG. 1 of common assignee U.S. Pat. No. 4,791,286; it shows on-chip components of a single channel lacking the A/D conversion of the present invention.

FIG. 3 (taken from U.S. Pat. No. 4,791,286) shows a much simpler single on-chip channel, of an earlier type than the system of FIG. 2. As stated above, each chip will have a large number of individual photo-detector circuits (e.g., 128) feeding into signal processing circuits, which are also on the chip. As shown in FIG. 3, an individual photo-detector 40 provides an input signal to a preamplifier 42. The output of amplifier 42, which directly receives the photo-detector signal, may be passed through an adaptive bandpass filter 44, and then fed into a multiplexer, which may, for example, be similar to that disclosed in U.S. Pat. No. 4,490,626, issued Dec. 25, 1984. In the circuitry of that application, the multiplexer comprises branches 46 and their control circuitry 48. Each branch 46 provides further amplification of each detector signal, as indicated diagrammatically at 50.

The signals exiting from channels of the type shown in FIGS. 2 and 3 are analog signals. The present invention provides on-chip analog to digital (A/D) signal conversion. This has significant benefits. The multiplexing of digital signals from the chips is more accurate and faster than analog multiplexing. Also, signals represented as digital words permit signal processing options to be performed better than analog signals, including thresholding functions, more sophisticated filtering functions, and image processing functions. Another advantage of focal plane A/D conversion is a much higher noise immunity to surrounding electronics. Furthermore, there is a reduction in processing electronics outside the cold (Dewar enclosed) portion of the electronic system.

The general objectives of the present invention may be summarized as: (1) Converting all of a large number of analog signals to corresponding digital words within one sample period (approximately 0.001 to 1.0 seconds); (2) Minimizing the power and area on the chip by locating certain A/D conversion functions off the chip; and (3) Minimizing the number of connections to the chip.

As stated above, in order to have on-chip A/D conversion, each channel on each chip must contain at least two components (i.e., 128 of each of these components must be on a chip having 128 channels):

(1) A comparator, which is a circuit with two inputs and one output. It is desired to have the comparator output switch from one logic state to the other (digital output) when the analog voltages of its two inputs are equal. In an ideal comparator, the output would switch instantaneously when the input difference is exactly zero, but some difference may be required to cause output switching. Certain enhancements described below are techniques for bringing the comparator closer to the ideal than is available with standard design techniques.

(2) A storage register, which is a digital memory circuit containing a number of identical storage cells. Each of these cells has two inputs and one output. One cell stores the logic state present at its data input when a clock is asserted at the control input, and continues to store the logic state until another clock is asserted. The number of cells in each register is equal to the number of bits desired in the A/D conversion.

The on-chip real estate may be conserved, when providing on-chip A/D signal conversion, by locating certain components elsewhere, and having them service a very high number of channels on multiple chips.

Each of the three circuits listed below is shared by all of the analog signals to be converted, i.e., there is only one of each such circuit required for a large number of analog channels, including channels on a plurality of chips. Any, or all, of these circuits could be located on the chip, requiring one of each per chip. Having them on the chips would reduce the number of connections between on-chip and off-chip circuitry, but would increase the area and power required on the chips. Also, if any of these circuits were on the chips, one such circuit could service only the channels on one chip, rather than channels on a multiplicity of chips.

The circuits which, for optimum results, are preferably located elsewhere than within the stacked chip modules, are:

(1) A counter, which is a digital circuit with one input and a number of outputs equal to the number of bits desired in the A/D converter. These outputs increment by one in binary value each time a clock is asserted at the input, except when the counter "ends-over", i.e., when the binary value goes from maximum (usually all 1s) to minimum (usually all 0s).

(2) A ramp generator, which is a circuit with one output and one input. The output is an analog voltage which increases (or decreases) by a constant amount per unit of time, except during a "reset" period when the output voltage changes rapidly from the final value to the initial value. This circuit may be implemented in a variety of ways. Two common techniques are:

A) Apply the output of the counter to inputs of a digital to analog converter (D/A). The output of the off-chip D/A converter will then be a series of small voltage increments, approximating a ramp. The D/A output returns rapidly to the initial value when the counter ends over.

B) Charge a capacitor with a constant current, causing the voltage on the capacitor to rise at a steady rate, i.e., as a ramp. The capacitor is returned to its initial value by closing an electronic switch which discharges the capacitor.

(3) A control, which is a digital circuit that coordinates the functions of the counter, ramp generator, and the digital circuits on the chip.

Figure 4:
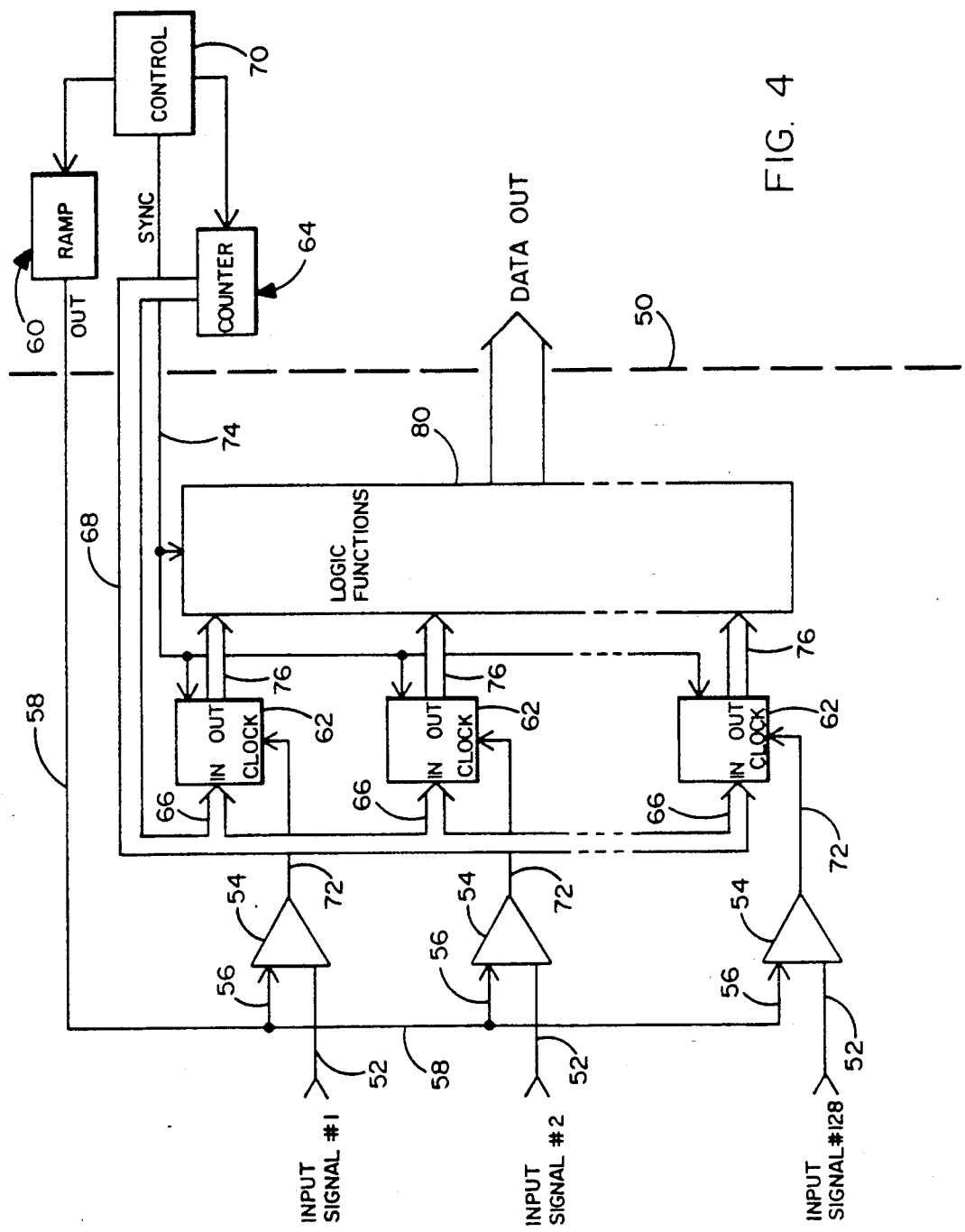
FIG. 4 is a block diagram showing the general concepts of the present invention, in which A/D conversion is accomplished by combining on chip and off chip circuits.

The general arrangement of the present invention is shown in FIG. 4. A vertical dashed line 50 separates the on-chip electronics on the left from the off-chip electronics on the right. Relative sizes of the on-chip and off-chip elements are not proportional to the blocks shown in the diagram.

The on-chip elements shown in FIG. 4 do not include the on-chip photodetectors, transimpedance amplifiers, or filters. The independent channels on one chip, assumed to total 128 in this version, each supply a photodetector-originated voltage signal on a line 52 to one input of a precision comparator 54. The other input 56 to each comparator is received from a common line 58. Line 58 carries the analog voltage output from an off-chip ramp generator 60.

Each channel, in addition to having its own comparator 54, requires its own storage register; i.e., a storage register 62 services each channel. The count stored in each storage register 62 is received from an off-chip counter 64. The off-chip counter is digitally incremented in a predetermined relationship with incremental analog changes in the off-chip ramp generator 60.

The off-chip counter 64 is connected to the inputs 66 of many parallel on-chip register devices 62 by means of a bus 68. It is assumed that a 13 bit signal on bus 68 will provide the necessary A/D conversion output signal from each on chip channel. So each register 62 contains 13 flip-flops.

A control 70 insures that the incremental changes in ramp 60 and counter 64 occur concurrently, in order to maintain the desired relationship between the analog and digital values. The cooperating analog and digital devices 60 and 64 may be thought of as synchronized voltage and digital ramps. Their A/D conversion function may be provided by ramping them up, or by ramping them down. After each complete ramping up or ramping down of the analog device 60 and the digital device 64, they are both reset to their original value, and another ramping cycle begins, after the period required for resetting.

Each storage register 62 is controlled by a strobe, or clock, input signal transmitted on the output line 72 of its comparator 54. The purpose of each register 62 in a given channel is to store therein the digital signal from counter 64 which exists at the instant the analog values at the two inputs 52 and 56 of the comparator in the same channel are equal. This is accomplished by having the output line 72 of each comparator 54 change its signal from high to low, or vice versa, at the instant the two inputs to that comparator are equal. When a changed output signal from a given comparator 54 provides a strobe signal at the "clock" terminal of the respective register 62, the flip-flops in that register are caused to store the counter value then present on the input line 66, which corresponds to the instantaneous value output of counter 64.

The following summary description of the circuitry in FIG. 4 assumes that the number of bits in the A/D conversion is 13, that the number of analog photodetector channels per chip is 128, and that the range of analog voltage is 0 to 5 volts. Each of these three parameters may have any desired value; but the stated values are typical of focal plane situations.

Referring again to FIG. 4, there are a large number of analog signals, in this example 128, one comparator for each analog signal, and one storage register per signal. A block 80 labelled "Logic Functions" in FIG. 4 is not a part of the basic concept of the present invention; it may include a variety of logic functions, such as: (a) Digital Multiplexing, in which the outputs of the storage registers are sequentially connected to a single set of output lines; (b) Buffer Storage, i.e., a second set of storage registers which hold the data from the A/D storage registers while the subsequent A/D conversion cycle is proceeding, thus permitting operation on the data of one A/D conversion while the next conversion is taking place; (c) Digital Offset Correction, which reduces the errors due to comparator input offset variation, one of the major factors limiting the precision of the A/D converter; and (d) Digital Thresholding, which detects whether the signal at the converter input is larger than some preset value.

Each of 128 input signals 52 is compared to a common reference ramp 60 by comparators 54 (one per signal). A digital number corresponding to the instantaneous amplitude of the reference ramp 60 is provided by counter 64 at the inputs 56 to each of the 128 storage registers. Each register 62 contains as many flip-flops as the number of bits in the conversion (13 in this case). When any comparator indicates that the reference sweep has just exceeded the signal input, the corresponding storage register is strobed to capture the digital number. After the reference ramp 60 and counter 64 have traversed their entire range (either minimum to maximum, or vice versa) the A/D conversion cycle is complete. At this time each and every storage register 62 will contain a 13 bit binary word, whose value represents the amplitude of the corresponding input signal. The time of ramp and counter traversal is made less than the sample period.

Thus, the first objective, stated above, has been met; namely, all of a large number of analog signals have been converted to corresponding digital words in one sample period. The second objective has been met because there are only two circuit blocks per signal on the chip, a comparator and a storage register. The third objective has also been met, because the total number of connections to the chip is 15: one ramp line 58, 13 counter bits on bus 68, and one synchronizer line.

A synchronizer line 74 from off-chip control 70, connected to the terminal 76 of each storage register 62, provides signals which control the unloading of each storage register into the downstream circuitry.

It should be noted that it is possible to implement this A/D converter with only 3 chip connections. This could be accomplished by placing a counter 64 on each chip. There would be only one counter per chip, so the impact on power and area would be modest. The three connections would then be: Ramp, Counter Clock, and Synchronizer.

FIG. 5 is a timing diagram, which shows the operation of the A/D conversion as a function of time. The top time line titled "Comparator Inputs" shows typical inputs to the comparator on one channel. There are two curves; the ramp curve 82 and the input signal curve 84. The ramp is a repetitive signal which rises at a constant rate and then resets to the minimum value. There is a delay between the reset and the time of start of the ramp, called "dead time". This time is not necessary, but will be present in most implementations. The dead time allows logical functions to be performed before the conversion starts the next cycle. It is not drawn to scale; i.e., it may be greater than, or less than, the conversion cycle time, which is the time for the ramp and the counter to traverse their total range. The input signal is a voltage that is changing with time. The purpose of the A/D converter is to convert the amplitude of the input signal to a corresponding digital code.

The second time line is titled "Comparator Output". It is shown as going from a low logic state to a high logic state when the inputs to the comparator are equal, as shown at point 86. It could also go from high to low; it is the change of state that is important. After the change in logic state, the output remains in the second state for a short time sufficient for the storage register to "grab" the binary code from the counter output. Following this short hold time, the comparator output state may either remain in its final state, or return to its initial state (indicated by the dashed lines), until the beginning of the next conversion cycle, when it must be in its initial logic state (low in the diagram). Note that it is the change in output that indicates the comparison.

The next group of four time lines, titled "Counter Output", show the output of the counter's four most significant bits (MSB). The lowest four time lines, titled "Storage Register Output", show the four MSBs of the storage register output. The less significant bits of both the counter and the register behave in a similar manner, but at higher frequencies. Note that the counter does not begin incrementing until the time start of the ramp.

At the instant of comparison, shown by vertical line 88, the storage register stores the logical state of each bit of the counter. For the first comparison in the figure the code for bits N through N-3 is 0 1 1 1, for the second (see line 89) 1 0 1 0. As soon as the storage register outputs have settled to their final state, the A/D conversion is complete for the corresponding channel input signal.

Note that the conversions in different channels take place at different times, relative to the time of start of the ramp and counter. In fact, conversion can take place at any time between the start and the end of the ramp and counter traverse, with conversions for smaller signals occurring earlier than those for larger signals. Note also that the counter does not need to count in a simple binary progression as shown, provided each binary code is unique from all others. In addition, the ramp does not need to be ascending, as shown, but may be descending. In fact, neither the counter nor the ramp needs to change at a constant rate. Signal compression could be accomplished with this A/D converter by varying the rate of change of the ramp and/or the counter during the conversion cycle. Signal compression is often used to obtain higher resolution for smaller signals and lower resolution for larger signals. As an example, this could be done if the ramp in the figure were to have a rapid rate of change at the beginning and a slower rate toward the end.

The above description covers the primary circuit elements of practical on-chip A/D conversion. The need to conserve on-chip real estate is obvious, because of the lack of space availability at the focal plane. The need to minimize on-chip power requirements may result from the location of the focal plane modules in a cold (Dewar) environment. The required low temperature needed by the photodetectors can not be effectively maintained if the on-chip power requirements are too high.

Certain chip circuit enhancements are considered highly desirable, and perhaps necessary, in order to obtain two benefits: (1) Minimize the on-time of each precision comparator 54, in order to minimize power usage; (2) Increase accuracy and resolution at each comparator 54, by subtracting its offset, or error voltage.

If the comparators 54 were designed using ordinary and well established techniques, the A/D converter would perform well, but with low accuracy and resolution. Six to eight bits resolution would be the limit of performance. In order to have higher accuracy and resolution, enhancements to the comparator should be incorporated.

In order to achieve higher performance, the comparator must have unique design features; and/or circuits must be added on the chip that compensate for variations among the comparators. This is true for two reasons: (1) The variation in input offset values of conventional comparators is too large to permit more than 6 to 8 bits accuracy; (2) The power required by a comparator rises rapidly when increased speed of response is required. For each bit increase in resolution, the speed of the comparator must increase by a factor of two. Thus, a 13 bit A/D requires a comparator 128 times faster than a 6 bit A/D. The power increases more rapidly than the speed, so more (perhaps much more) than 128 times the power will be required. Focal plane applications require resolutions of 12 to 14 bits. The comparator power required for such resolutions far exceeds the power permitted on the chip.

Two primary enhancements to on-chip comparators have been provided. The first is offset correction, which reduces the error in the comparison of the ramp signal and the channel input signal. The second enhancement is low duty cycle powering of the precision comparators.

Offset Correction—The output of an ideal comparator changes logical state when the difference at the input terminals is exactly zero. In ordinary CMOS comparator circuits the input difference may be as much as ±50 millivolts. This input difference varies from one circuit to another, and is called the input offset. In order to have precision corresponding to 13 bits, the offset variation must be less than ±0.3 millivolts for a five volt signal.

There are two general methods of reducing the input offset: analog and digital. Both methods use some means of measuring, then storing the offset. This stored value is then subtracted from the signal, thus compensating for the error the offset would have caused. In the analog method, the means of measuring is by forcing the input difference to zero; and the means of storage is a capacitor. In the digital method, the means of measuring is to perform trial comparisons with known inputs, which permits recording and storing the offset when a valid comparison occurs. The means of storage is a storage register. Note that the digital method requires a preliminary A/D conversion, which generates a digital code representing the offset value. This value is stored and subtracted (by digital means) after the signal A/D conversion is performed. Thus in the digital method, two successive A/D conversions are required. Since the offset changes slowly, the preliminary offset conversion need not be performed for every signal conversion, but must be performed often enough to compensate for offset drift due to time and temperature. The analog method does not require prior A/D conversion, but will most likely be performed for every conversion cycle, because voltage on the storage capacitor will drift due to circuit leakage. Each of these methods may be implemented in a variety of ways.

Low Duty Cycle Power—As noted earlier in this discussion, the power required for an ordinary CMOS comparator is larger than allowed for focal plane applications. The general method for overcoming this large power requirement involves sensing when the ramp and input are close, but not yet equal, by means of a coarse comparison which requires less power than a comparison of the required precision. When this coarse comparison indicates that the ramp and signal are close in value, a precision comparison mode is activated. The precision comparison requires considerably more power, but is activated for only a short time. Since the high power, precision comparison is active for a period much shorter than the total conversion time, the average power is reduced. The ratio of the time of activation of an operation divided by the time between activations is the "duty cycle", thus the name in this case of "Low Duty Cycle Power". Two implementations of this method have been provided. One of these uses two comparators, one of low precision and low power, and another of high precision and high power. The low precision comparator senses when the ramp and signal are close in value, and turns on the power to the high precision comparator at that time. Shortly after the precision comparison is made, all power to both comparators is turned off. The other implementation uses one comparator operating in two modes: a low precision—low power mode, and a high precision—high power mode. Each mode performs the same operation as the corresponding comparator in the two comparator implementation.

The on-chip enhancements of the present invention, as shown in FIGS. 6 and 7, initially were performed in the analog mode. Development work, subsequent to that of the present inventor, has been performed by others, on behalf of the assignee of the present invention. This work, which may be the subject of one or more later applications, includes the use of the digital mode, instead of the analog mode, for performing the on-chip enhancements. These digital mode concepts will be briefly described below, as useful in showing alternative means of performing equivalent functions.

FIG. 6 discloses an on-chip circuit which includes a precision comparator (in one of the channels), and means for subtracting the comparator's offset voltage from the incoming photodetector-generated signal. The offset voltage is stored on a capacitor between analog signal inputs. In FIG. 6, the voltage signal on the photodetector channel is input on line 100. It is applied to the gate 102 of a MOSFET transistor 104. The incoming signal on line 100 is connected and disconnected by a clock-controlled transistor switch 106; and, when switch 106 is closed, the incoming signal is present on the input side of a capacitor 108. The output side of capacitor 108 is connected to gate 102. A transistor switch 110 clamps the gate voltage of transistor 104 to the operating voltage, as determined by the current supplied by a transistor 112.

A two phase sequence controls the offset compensation. In the first phase, switch 106 is open, and switch 110 is closed. In this phase, the offset voltage is impressed across capacitor 108, and the input signal is cut off. In the second phase, switch 106 is closed, and switch 110 is open. In this phase, the input signal is connected through capacitor 108 to gate 102. The input voltage signal is changed by the amount of offset voltage stored on capacitor 108. The corrected signal is amplified by transistor 104, and sent to a subsequent comparator stage by a source follower transistor 114. Second and third stages of gain are generally required in the comparator. Such stages may be approximate duplications of the first stage.

FIG. 7 discloses an on-chip circuit which operates in the analog mode to reduce the duty cycle of each precision comparator. A precision comparator 120 is turned on and off by a "window-detector", which may comprise a pair of low precision comparators 122 and 124, so combined as to give a logic true when the input voltage difference is between two values. The magnitude of this difference "window" is $2 \times VA$, with a nominal center at zero voltage difference. The output of the window detector controls the supply current to the precision comparator 120. When the difference between the voltage (on line 126) and the channel voltage signal is outside the window, the precision comparator supply current is held to zero. When the difference is within the window, the precision comparator supply current is turned on; and it makes the needed comparison when the input difference is nominally zero. The window detector comparators can be low precision, and not as fast as the precision comparator.

In the figure, the area containing low precision comparators 122 and 124 is enclosed within a dashed line rectangle 128. This circuitry is required for each channel. A dashed line rectangle 130 encloses a circuit connected between ramp signal 126 and one input of each of the two comparators 122 and 124. The circuitry in rectangle 130 serves all the channels on a given chip.

Figure 8:
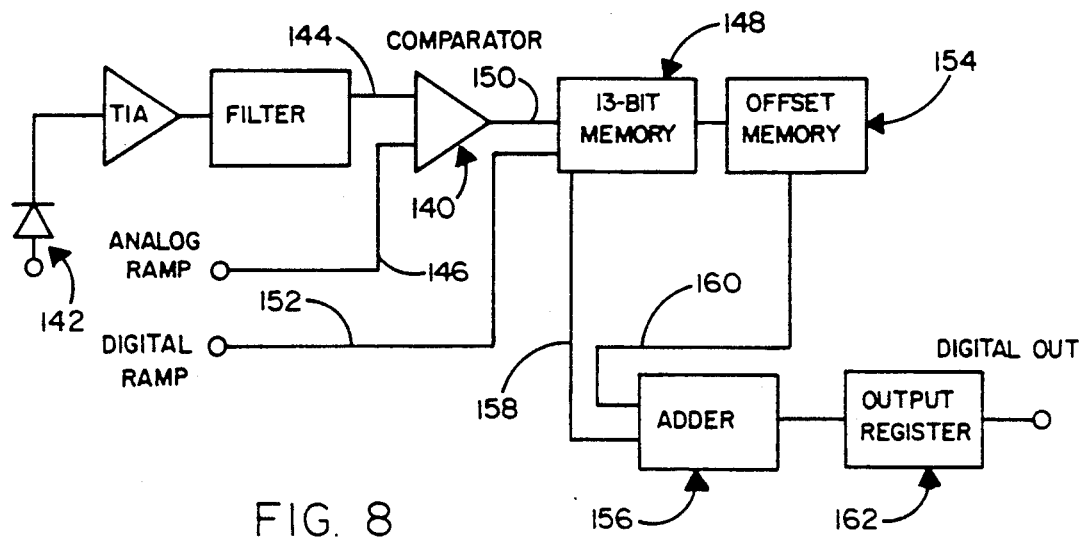
FIG. 8 is a diagram of circuitry for using digital means in each channel to compensate for offset voltage of the associated precision comparator.
Figure 9A:
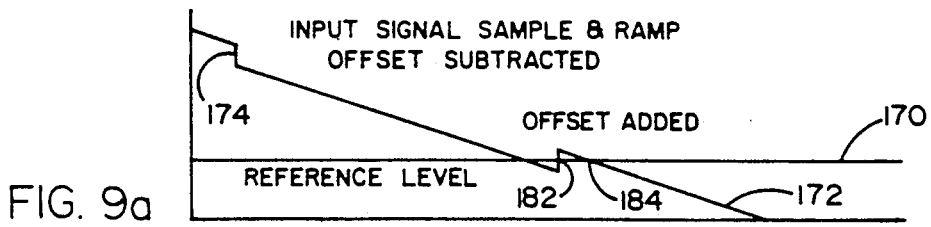
FIG. 9 is a timing diagram showing the use of a digital strobing technique to reduce the duty cycle of the associated precision comparator.
Figure 9B:
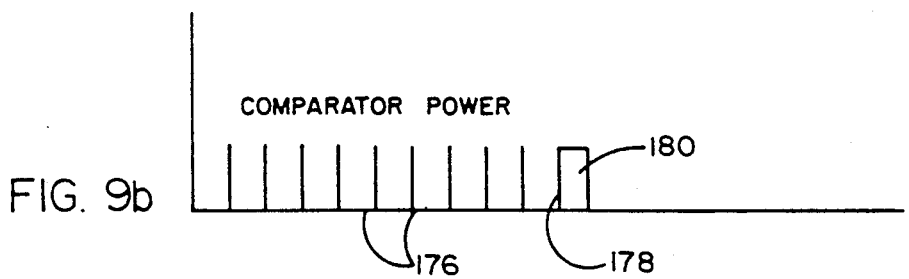
Figure 9C:
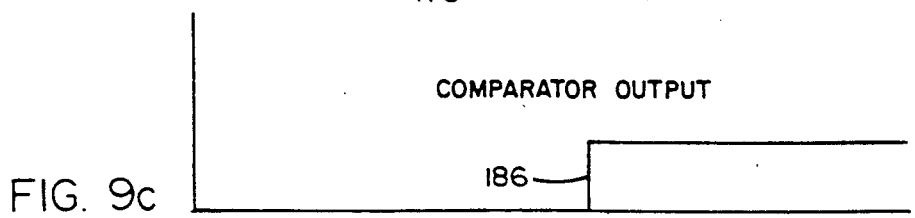

FIGS. 8 and 9 show digital equivalents of the voltage offset compensation and duty cycle reduction concepts shown in the analog mode in FIGS. 6 and 7.

FIG. 8 shows a diagram of digital offset compensation circuitry incorporated in an on-chip channel. An in-channel comparator 140 receives input signals from a photodetector 142 on line 144, and from an off-chip analog ramp on line 146. A 13 bit memory (storage register) 148 in the same channel has one input line 150 from comparator 140, and another input line 152 from an off-chip digital ramp. Additional circuitry in each channel includes an offset memory 154 and an adder 156. The adder 156 receives input signals on lines 158 and 160 from the 13 bit memory and the offset memory, respectively.

Offset correction is accomplished by showing a blank scene on the photodetectors, and capturing the digital words which correspond to that scene in the offset memory 154 of each channel. The offset memory needs only the least significant 6 or 8 bits. Thus, each offset memory 154 holds the digital value of zero input. The stored digital offset value is fed to adder 156, along with the digital data of the 13 bit memory 148, and is subtracted from the digitized scene, before the corrected digital value is fed to an output register 162, which sends multiplexed signals off the chip.

FIG. 9 shows a timing diagram of a digital strobing technique used to reduce the duty cycle (and thus, the power consumption) of the comparator (not shown) in each channel. As seen along the top horizontal row A, a "reference level" value 170, which represents the photodetector signal, extends horizontally. In order to input a non-fluctuating value during one cycle, a sample-and-hold capacitor may be used to provide a temporarily stabilized signal entering one input of the comparator.

In row A of FIG. 9, the ramp signal is a descending voltage, as shown by line 172. A small offset voltage is subtracted at 174 from the input ramp signal. Along row B of FIG. 9, timed strobing signals 176 are used to ask the comparator if line 172 (including the offset) has intersected line 170. In the figure, this intersection occurs at 178, causing the comparator to remain on until its output signal has changed. The on period is shown by the solid black time interval 180. The initial intersection at 178 also causes the offset voltage, which was subtracted at 174, to be added to the ramp voltage at 182. The comparator remains on until the decreasing ramp voltage intersects line 170 a second time at 184. This second intersection changes the comparator output from one state to the other, as shown at 186 on row C, thus capturing the appropriate digital count in the associated storage register. The strobing technique reduces the power consumption of the comparator to about one-eighth of the power which would be required for full time comparator operation.

From the foregoing description, it will be apparent that the apparatuses and methods disclosed in this application will provide the significant functional benefits summarized in the introductory portion of the specification.

The following claims are intended not only to cover the specific embodiments and methods disclosed, but also to cover the inventive concepts explained herein with the maximum breadth and comprehensiveness permitted by the prior art.

What is claimed is:

1. In an electronic system containing a densely packaged three-dimensional structure which includes circuitry for obtaining and processing analog photodetector signals, such structure (a) being formed by a plurality of stacked circuitry-carrying layers, each having a plurality of parallel signal channels, and (b) having a two-dimensional array of photodetectors located on one surface of the structure, each in contact with a separate signal channel; analog to digital conversion circuitry comprising:

a comparator in each channel having two analog signal inputs and one digital output, one of its input signals being received from the photodetector in the same channel;

a storage register in each channel adapted to receive and store digital values;

an analog voltage ramp generator which has its analog output connected to one input of each comparator in each of a plurality of channels;

a counter which develops a changing digital value incrementally proportional to the simultaneous analog signal of the ramp generator, and which has its output connected to each storage register in each of a plurality of channels;

each comparator being so arranged that its output changes from one digital value to the other when its two analog voltage inputs reach substantial equality; and the connection of each comparator to the same channel storage register being such that the storage register maintains the specific output counter value existing at the time of change of the output signal of the same channel comparator.

2. The electronic system of claim 1 in which the analog voltage ramp generator is located outside the three-dimensional structure.

3. The electronic system of claim 1 in which the counter is located outside the three-dimensional structure.

4. The electronic system of claim 2 in which the counter is located outside the three-dimensional structure.

5. The electronic system of claim 1 in which:
the three-dimensional structure is located in a low temperature environment; and
the analog ramp and counter are located in a higher temperature environment.

6. The electronic system of claim 1 which also comprises:
error compensating means for adjusting the comparator channel signal to compensate for the voltage offset error of the comparator.

7. The electronic system of claim 6 in which an error compensating means is included in each channel.

8. The electronic system of claim 4 which also comprises:
error compensating means for adjusting the comparator channel signal to compensate for the voltage offset error of the comparator.

9. The electronic system of claim 8 in which an error compensating means is included in each channel.

10. The electronic system of claim 1 which also comprises:
power reducing means for causing the duty cycle of the comparator to constitute only a small fraction of a full duty cycle.

11. The electronic system of claim 10 in which a power reducing means is included in each channel.

12. The electronic system of claim 4 which also comprises:
power reducing means for causing the duty cycle of the comparator to constitute only a small fraction of a full duty cycle.

13. The electronic system of claim 12 in which a power reducing means is included in each channel.

14. The electronic system of claim 8 which also comprises:
power reducing means for causing the duty cycle of the comparator to constitute only a small fraction of a full duty cycle.

15. The electronic system of claim 14 in which an error compensating means and a power reducing means are included in each channel.

16. An electronic system containing an array of analog signal generators, and adjacent parallel channels for such analog signals;

a comparator in each channel having two analog signal inputs and one digital output, one of its input signals being received from the signal generator in the same channel;

a storage register in each channel adapted to receive and store digital values;

an analog voltage ramp generator which has its analog output connected to one input of each comparator in each of a plurality of channels;

a counter which develops a changing digital value incrementally proportional to the simultaneous analog signal of the ramp generator, and which has its output connected to each storage register in each of a plurality of channels;

each comparator being so arranged that its output changes from one digital value to the other when its two analog voltage inputs reach substantial equality; and the connection of each comparator to the same channel storage register being such that the storage register maintains the specific counter output value existing at the time of change of the output signal of the same channel comparator.

17. The electronic system of claim 16 in which:

the parallel channels are located on an integrated circuit chip; and the voltage ramp generator and counter are located elsewhere.

18. The electronic system of claim 17 in which the integrated circuit chip is located inside a cooled structure.

19. The electronic system of claim 16 which also comprises:

error compensating means for adjusting the comparator channel signal to compensate for the voltage offset error of the comparator.

20. The electronic system of claim 19 in which an error compensating means is included in each channel.

21. The electronic system of claim 16 which also comprises:

power reducing means for causing the duty cycle of the comparator to constitute only a small fraction of a full duty cycle.

22. The electronic system of claim 21 in which a power reducing means is included in each channel.

23. The electronic system of claim 16 in which an error compensating means and a power reducing means are included in each channel.

24. The electronic system of claim 17 which also comprises:

error compensating means for adjusting the comparator channel signal to compensate for the voltage offset error of the comparator.

25. The electronic system of claim 24 in which an error compensating means is included in each channel.

26. The electronic system of claim 17 which also comprises:

power reducing means for causing the duty cycle of the comparator to cinstitute only a small fraction of a full duty cycle.

27. The electronic system of claim 26 in which a power reducing means is included in each channel.

28. The electronic system of claim 17 in which an error compensating means and a power reducing means are included in each channel.

29. The electronic system of claim 18 which also comprises:

error compensating means for adjusting the comparator channel signal to compensate for the voltage offset error of the comparator.

30. The electronic system of claim 29 in which an error compensating means is included in each channel.

31. The electronic system of claim 18 which also comprises:

power reducing means for causing the duty cycle of the comparator to cinstitute only a small fraction of a full duty cycle.

32. The electronic system of claim 31 in which a power reducing means is included in each channel.

33. The electronic system of claim 18 in which an error compensating means and a power reducing means are included in each channel.

34. In an electronic system having an array of analog signal generators, integrated circuitry immediately adjacent to such signal generators, and additional non-adjacent processing circuitry, the method of enhancing the efficiency of the electronic system which comprises:

including in the integrated circuitry a plurality of parallel channels, each receiving an incoming analog signal from a separate signal generator, and each containing a comparator and a storage register;

inputting the analog signal in each channel to one input of the comparator in the same channel;

inputting an analog ramp generator signal to the other input of each comparator;

emitting an output signal from each comparator when its input signals reach equality;

changing the digital value in each of the storage registers by inputting to them a changing value from a counter, such changing value being incrementally proportional to the analog ramp generator signal; and using the output signal of each comparator to capture and hold the digital value in the same channel storage register.

35. The method of claim 34 in which the analog ramp generator and the counter are included in the non-adjacent processing circuitry.

* * * * *